United States Patent
Rossi

(10) Patent No.: US 7,344,085 B2
(45) Date of Patent: Mar. 18, 2008

(54) MULTILAYER EXPANSION CARD FOR ELECTRONIC APPARATUS AND RELATIVE PRODUCTION METHOD

(75) Inventor: Mauro Rossi, Gemona Del Friuli (UD) (IT)

(73) Assignee: Eurotech SpA, Amaro (UD) (IT)

( * ) Notice: Subject to any disclaimer, the term of this patent is extended or adjusted under 35 U.S.C. 154(b) by 176 days.

(21) Appl. No.: 11/060,360

(22) Filed: Feb. 18, 2005

(65) Prior Publication Data
US 2005/0190537 A1 Sep. 1, 2005

(30) Foreign Application Priority Data
Feb. 27, 2004 (IT) .......................... UD2004A0034

(51) Int. Cl.
*G06K 7/00* (2006.01)
(52) U.S. Cl. ...................................... 235/486; 235/492
(58) Field of Classification Search ................ 235/486, 235/487, 490, 492
See application file for complete search history.

(56) References Cited

U.S. PATENT DOCUMENTS

| | | | |
|---|---|---|---|
| 4,740,414 A | 4/1988 | Shaheen | |
| 5,156,552 A | 10/1992 | Zaderej et al. | |
| 5,865,631 A | 2/1999 | Berto et al. | |
| 6,421,250 B1 | 7/2002 | Kim et al. | |
| 6,671,181 B2 * | 12/2003 | Kaminski | 361/759 |
| 6,908,038 B1 * | 6/2005 | Le | 235/492 |
| 2002/0017397 A1 | 2/2002 | Ramey et al. | |
| 2003/0081387 A1 | 5/2003 | Schluz et al. | |

FOREIGN PATENT DOCUMENTS

| | | |
|---|---|---|
| FR | 1419772 | 12/1965 |
| JP | 58056497 | 4/1983 |
| JP | 05074526 | 3/1993 |
| JP | 08037381 | 2/1996 |

OTHER PUBLICATIONS

Patent Abstract of Japan vol. 017, No. 398 (E-1403), Jul. 26, 1993 & JP 05 074526 A (NEC Niigata Ltd), Mar. 26, 1993 abstract.
Patent Abstract of Japan vol. 1996, No. 06, Jun. 28, 1996 & JP 08 037381 A (Hitachi Chem Co Ltd), Feb. 6, 1996 abstract.

* cited by examiner

*Primary Examiner*—Daniel Stcyr
(74) *Attorney, Agent, or Firm*—Stevens, Davis, Miller & Mosher, LLP

(57) ABSTRACT

Multilayer expansion card for connecting an apparatus or device to an electronic apparatus, particularly for association to a mother card of a Personal Computer. The card comprises a first part, intended principally for connection, having a thickness coherent with the requirements of size for connection to the standard slots of the mother card, and a second part, intended principally for the management of the card functions and for processing, and hence the electronics, having a greater thickness with respect to the first part in order to contain a correspondingly greater number of layers intended for the management of a high density of electronic-type signals.

7 Claims, 2 Drawing Sheets

MULTILAYER EXPANSION CARD FOR ELECTRONIC APPARATUS AND RELATIVE PRODUCTION METHOD

FIELD OF THE INVENTION

The present invention concerns a multilayer expansion card applicable to an electronic apparatus, such as a personal computer, in order to connect to, and/or manage, any apparatus or device whatsoever.

The invention also concerns the method to produce the multilayer expansion card.

BACKGROUND OF THE INVENTION

Expansion cards are known, for example those called PCI, used to connect and/or manage an external apparatus or device, for example a monitor, a peripheral unit, etc., on an electronic apparatus such as a personal computer.

In order to conform to the standard of size, such expansion cards have to have a unified thickness to allow the male connector present on the edge of the card to be inserted into the female connector, or slot, located on the mother card of the electronic apparatus.

Various connection standards exist which have respective unified values: an example of this is the PCI standard, according to which the thickness of the connector on the card must be equal to 1.57±mm 0.2 mm; other examples, among the many others, are the SODIMM standard (standard thickness 1.0 mm), the miniPC standard (thickness 1.0 mm) and the DIMM standard (1.27 mm).

Cards used at present have a problem when they are required to manage a large number of digital signals at high speed, with recourse to controlled impedance paths. This situation occurs, for example, when cards and systems are designed for the field of High Performance Computing (HPC). In this case, in fact, it is necessary to use particular structures so as to have transmission lines with controlled impedance: the paths are located between mass islands, in a kind of sandwich structure, or in other, similar configurations. These structures allow to control and maintain the impedance constant along the electric track. The quicker the signal rise time is, and the longer the path, the more fundamental it is to have a good control of the impedance values on the line.

The applications mentioned above entail the presence of a large number of signals which, arranged in groups, move from one point to another, generating a sort of communication network between the computing nodes. This large number of signals must therefore be managed using transmission lines with controlled impedance and, if we want to arrange said rapid digital signals correctly, it is necessary to arrange a lot of layers on the printed circuit of the PCI card.

The need to have a large number of layers clashes with the need to respect a card thickness which satisfies the constraint of size, as imposed by the standard for inserting the card into the slot located on the mother card.

Some production processes are well-known, which allow to increase the number of layers without infringing the aforesaid requirements of thickness, technological limits and impedance values. Among these production processes it is known to use additional processes with sequential coating (and laser drilling), or with the introduction of particular materials for the dielectric sub-strates, which determine a lesser value of the dielectric constant and hence the possibility of using thinner sub-strates.

These processes allow to reduce the thickness of some of the sub-strates present in the card, and in this way it is possible to add auxiliary signal layers.

However, there are some designs for cards wherein these methods cannot be used or they do not have a great real utility.

One example is the case where a large number of signals has to travel inside the printed circuit, following parallel paths, in the same direction.

A possible approach to manage these signals is to provide a local coupling of cards using card-to-card connectors or to introduce recent card-to-card welding technologies. However, there may be numerous disadvantages deriving from the use of these technologies:

increase in the overall height of the system, for example due to the need to have two cards, one above the other, with a certain distance between them;

additional assembly processes to allow to make the coupling system, for example assembly of the connectors or card-to-card welding;

introduction of additional materials, for example connectors, etc.

These features can make the relative production processes not advantageous in the case of some designs for cards.

Document U.S. Pat. No. 6,421,250B1 concerns a memory module to be associated with an electronic apparatus that comprises a printed circuit including, on one side, two protrusions on the surfaces of which connection feet are made for association with corresponding connection elements of the electronic apparatus. The purpose of the protrusions is to increase the number of feet in contact between the memory module and the electronic apparatus without increasing the size of the memory module itself.

However, this solution not only requires dedicated and specific connection slots, but also starts from a premise that is totally different with respect to the problem to which the present invention is intended to supply a solution.

In fact, while U.S.'250 achieves a specific connection geometry to keep the size of the memory module constant, in the present invention it is desired to obtain an increase, for example, in the processing capacity or in the functions of the expansion card, by increasing the number of the layers that make up at least part of the printed circuit, without modifying the geometry of the standard connections of the usual electronic apparatuses.

U.S. Pat. No. 4,740,414 also describes a solution wherein a printed circuit has, on one side, a specific connection part on which a plurality of connection contacts are made. In this case too, however, the purpose is to increase the number of connection points, keeping the size of the printed circuit unchanged; the purpose is not to increase the calculation capacity of the expansion card without modifying the standard connection part connecting to a slot of an electronic apparatus.

Purpose of the invention is to achieve a multilayer expansion card for an electronic apparatus which will allow to increase the number of planes or layers usable for managing the signals, in any case ensuring that the connection standards are respected (for example the PCI standard mentioned above), both in terms of size and also in terms of mechanical profile and arrangement of the contact areas.

Another purpose is to achieve an expansion card without having recourse to using particular dielectrics or additional independent cards and additional assembly processes.

The present Applicant has devised, tested and embodied this invention to obtain these purposes, to overcome the shortcomings mentioned above, and to obtain other advantages.

SUMMARY OF THE INVENTION

The present invention is set forth and characterized essentially in the main claims, while the dependent claims describe other innovative characteristics of the invention.

In accordance with the purposes indicated above, an expansion card according to the invention consists of a multilayer printed circuit comprising a greater number of layers in some areas, dedicated principally to the processing and management of the card functions (that is, to the electronics), and a smaller number in other areas, dedicated principally to connection with the standard slots of an electronic apparatus to which the expansion card is connected.

In other words, the printed circuit has a first number of layers which is smaller in the region where there are constraints of size affecting the thickness, and a second number of layers which is greater in the areas where it is necessary to manage a lot of signals. It is, therefore, a multilayer printed circuit with at least two different levels (or at least two different thicknesses).

To be more exact, in the example of PCI expansion cards able to be associated with mother cards of a personal computer, a first part of the expansion card has a thickness, and also a mechanical profile and an arrangement of the connections, coherent with the connection size standards, for example 1.57 mm±0.2 mm, while a second part of the card has a greater thickness in a zone dedicated principally to the development of the card functions and processing (that is, to the electronics); this allows, in this second part, to place thereon a greater number of layers and hence to manage a greater number of signals.

According to a preferential embodiment of the invention, the expansion card is made by using the technology of sub-sets, taking into account that the two sub-sets, at least at the end of the process, do not have the same factor of form.

To be more exact, a first sub-set having the thickness corresponding to that of the thinnest zone, and a plane size substantially equal to that of the complete card, is assembled to a second sub-set, having about the thickness corresponding to the difference between the total thickness of the card and that of the thinnest zone. This second sub-set has a smaller plane size than that of the first sub-set, so as to expose, for connection purposes, a part of the card having a smaller thickness and coherent with the size standards required for said connection.

BRIEF DESCRIPTION OF THE DRAWINGS

These and other characteristics of the present invention will become apparent from the following description of a preferential form of embodiment, given as a non-restrictive example with reference to the attached drawings wherein.

DETAILED DESCRIPTION OF A PREFERENTIAL FORM OF EMBODIMENT OF THE INVENTION

Figure 1:
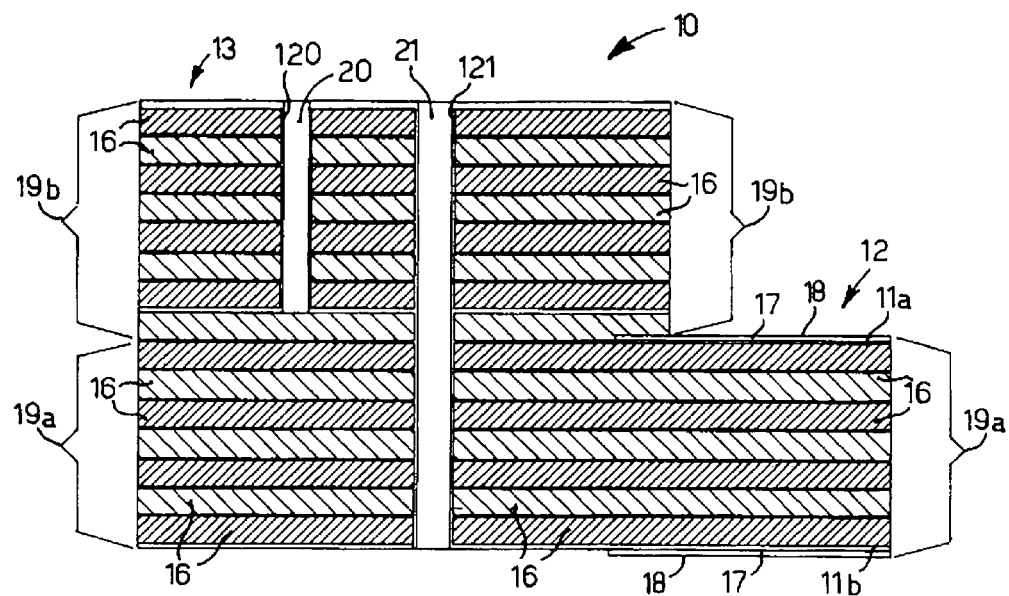
FIG. 1 is a view in section (localized near the area of the connector on the card) of a form of embodiment of the multilayer expansion card with two levels according to the present invention.

With reference to the attached drawings, the reference number 10 denotes a typical multilayer expansion card for an electronic apparatus, usable to connect to said electronic apparatus additional or integrative devices or elements such as audio or video management devices, monitors, printers, peripheral units, etc.

The card 10 consists of a plurality of copper layers 11 to manage the signal lines, separated from each other by relative sheets of dielectric material 16. Each layer 11, for example, at least initially, has a thickness of about 17 μm while the thickness of the sheets of dielectric material is normally variable from 150 to 250 μm.

As can be seen from FIG. 1, the card 10 has a first zone 12, or connection part, comprising a first number of layers, in this case eight, and a second zone 13, or processing part, comprising a second number of layers, in this case sixteen.

Figure 2:
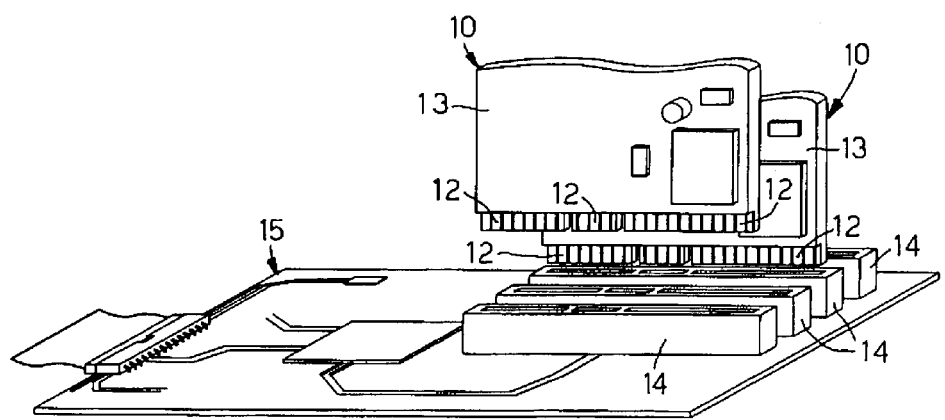
FIG. 2 is a schematic perspective view of a multilayer expansion card with two levels according to the invention prepared for connection with a mother card of an electronic apparatus.

The first connection part 12 has in all a thickness coherent with the standard size compatible with its being inserted into the relative slot 14 present on the mother card 15 of an electronic apparatus, not shown in greater detail in FIG. 2. According to the known PCI standard, for example, this size is equal to 1.57 mm±0.2 mm.

The first connection part 12 also has a mechanical profile and an arrangement of the connections that are coherent with the mechanical profile and the arrangement of the standardized connections of the slot 14 of the relative mother card, so as to render said expansion card 10 able to be coupled perfectly with the relative mother card 15 without any loss of performance and without requiring any mechanical adaptation.

The second processing part 13 has a thickness coherent with the need to guarantee a number of layers such as to ensure a very high capacity to manage signals (even high speed), respecting possible constraints of assembly, bulk and/or geometries for coupling with other adjacent members or devices. In the example shown here this greater thickness is equal to about 3.1 mm.

Figure 4:
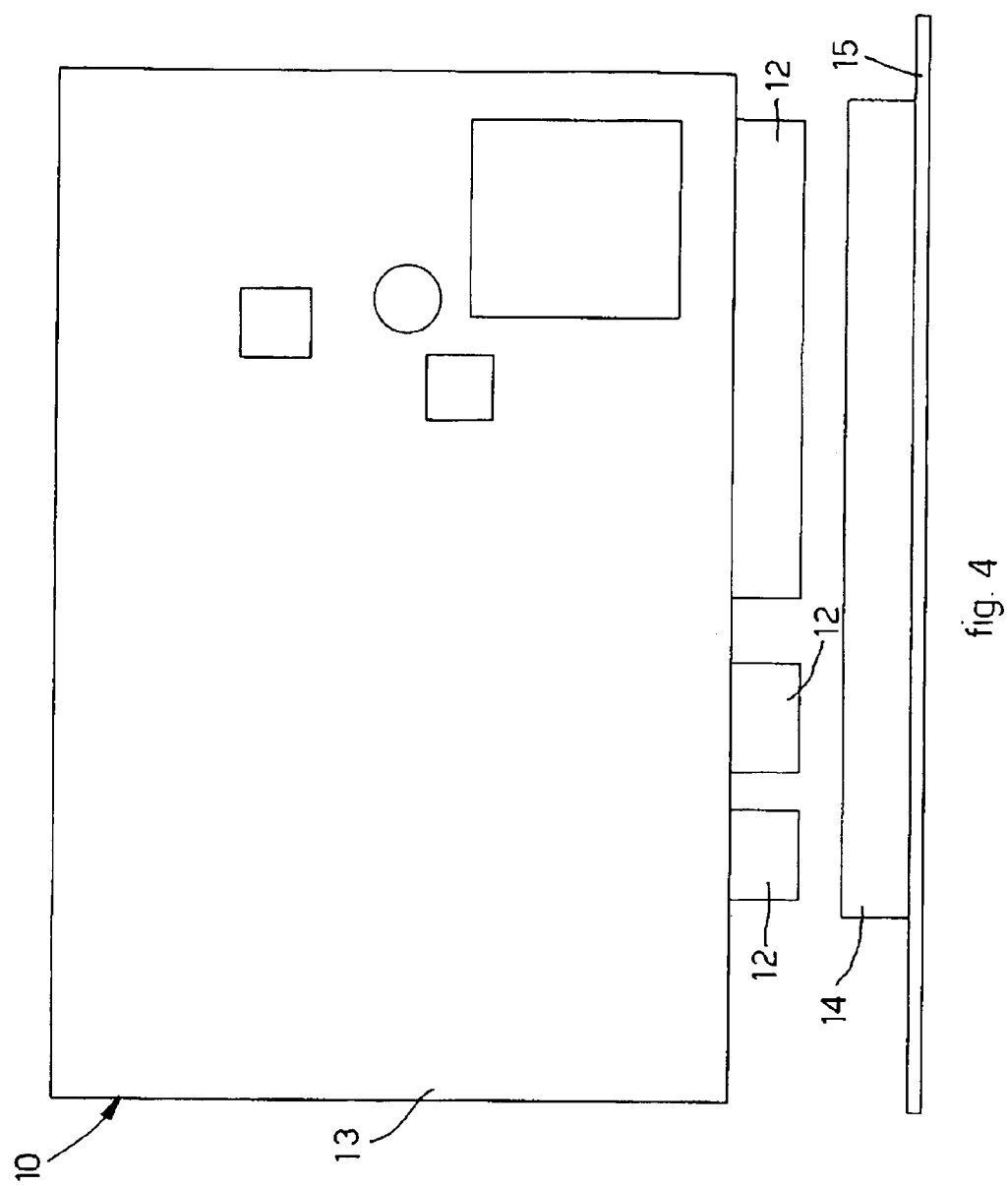
FIGS. 3 and 4 show, respectively from the side and from the front, an expansion card prepared for connection with a relative mother card.
Figure 3:
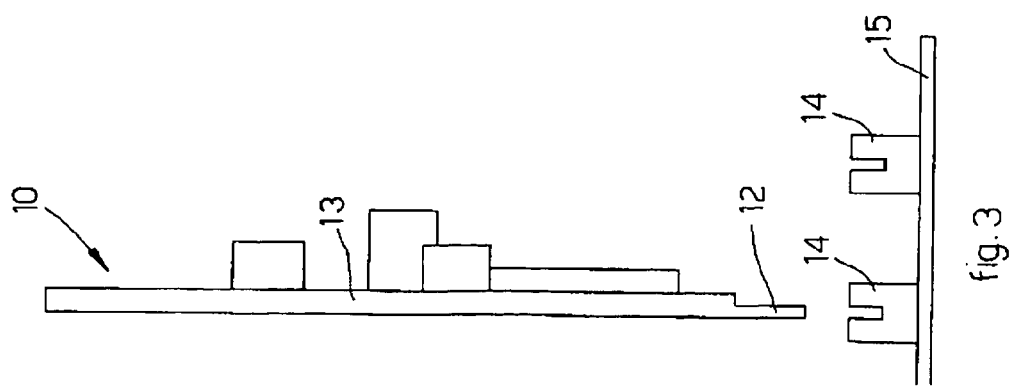

Thanks to this multilayer configuration with differentiated thickness, as can be seen in FIGS. 2-4, the invention guarantees the possibility of achieving a coupling of the cards 10 in relative standardized slots 14 of a mother card 15 of an electronic apparatus without requiring any modification to the connection part of said electronic apparatuses; at the same time, thanks to the greater thickness in the part 13 not dedicated to connection, but dedicated principally to the development and management of the card electronics, the invention ensures a very high processing capacity for the cards 10.

The connection part 12, on the level of the upper layer 11a and on the level of the lower layer 11b, has the metalized connector 17 with, externally, a hard gold covering 18 with a thickness of at least 1 μm, as required by the connection standards (for example PCI).

The processing part 13 is also completed with a through hole 21 provided with a relative metallization 121, and optionally with a blind hole 20, provided with relative metallization 120. With reference to FIG. 1, the blind hole can also be made on the lower sub-set 19a, even though it is not shown there.

The method to make the cards 10 provides, in a preferential embodiment, to make a first sub-set, indicated in its entirety by the reference number 19a, of a thickness substantially equal to the thickness of the connection part 12 and of a plane size substantially equal to the plane size of the entire card. The first sub-set 19a is completed by means of finishing with hard gold 18 on the level of the upper metalized layer 11a.

Then, a second sub-set is made, indicated in its entirety by the reference number 19b, of a thickness about equal to the difference between the thickness of the processing part 13 and the thickness of the connection part 12, which, at the end of the production process will have a plane size less than that of the sub-set 19a, so that the part 12 dedicated to connection remains exposed.

The sub-set 19b can be equipped with the hole 20 and relative metallization 120 which, after assembly with the sub-set 19a, will be blind. The lower sub-set 19a can also be equipped, if necessary, with an independent hole, in exactly the same way as the upper sub-set 19b.

The two sub-sets 19a and 19b are pressed together, possibly using non-adhesive materials on the level of the upper layer 11a, so as to allow afterwards an easy removal of the excess material belonging to the sub-set 19b with consequent exposure of the connection area. The through hole 21 is then completed with the relative metallization 121 and the hard gold covering 18 is applied on the level of the upper layer 11a.

It is clear, however, that modifications and/or additions of parts may be made to the multilayer expansion card 10 and the production method thereof as described heretofore, without departing from the field and scope of the present invention.

It is evident, for example, that the number of layers, the relative thicknesses, the holes, the coverings, and all the other features of size and technology are indicated in the example given here purely as an example: they can change according to the variation in values or parameters of standardization, or according to specific cases or applications.

It is also evident that the specific values indicated are adapted on each occasion to the specific standards of size required, some of which, but only as an example, have been mentioned in the first part of the description.

It is also clear that, although the present invention has been described with reference to specific examples, a person of skill in the art shall certainly be able to achieve many other equivalent forms of expansion card, or its method of production, all of which shall come within the field and scope of the present invention.

The invention claimed is:

1. Method to make a multilayer expansion card for connecting an apparatus or device to an electronic apparatus, comprising a first part, intended principally for connection, having a thickness coherent with requirements of size for connection to standard slots of a mother card of the electronic apparatus, and a second part, intended principally for management of functions of the expansion card and for processing, and hence electronics of the expansion card, having a greater thickness with respect to said first part to contain a correspondingly greater number of layers intended for management of a high density of electronic signals, said method comprising the steps of:

a first step wherein a first sub-set is made, of a thickness substantially equal to the thickness of a connection part of said expansion card and of a plane size substantially equal to the plane size of the entire final expansion card;

a second step wherein a second sub-set is made, of a thickness substantially equal to the difference between the total thickness of said expansion card and the thickness of said connection part, and which at the end of the production process will have a plane size less than that of said first sub-set, so that the part dedicated to connection remains exposed;

a third step wherein the two sub-sets are assembled together by means of pressing.

2. Method as in claim 1, wherein the thickness of said first part is the PCI standard equal to 1.57 mm±0.2 mm.

3. Method as in claim 1, wherein said first part has a mechanical profile, an arrangement and a size of the contact areas coherent with the standard slots of the mother card.

4. Method as in claim 1, wherein in their exposed part, outer layers of said first part have a hard gold covering.

5. Method as in claim 1, wherein said electronic signals are arranged on paths and structures with controlled impedance of common use in high speed electronics.

6. Method as in claim 1, wherein said third step is performed with the aid of non-adhesive materials to allow the removal of excess material belonging to said second sub-set to expose the connector.

7. Method as in claim 1, wherein said mother card comprises a mother card of a Personal Computer.

* * * * *